United States Patent
Wakui

[19]

[11] Patent Number: 5,844,909
[45] Date of Patent: Dec. 1, 1998

[54] TEST PATTERN SELECTION METHOD FOR TESTING OF INTEGRATED CIRCUIT

[75] Inventor: Kazuo Wakui, Tokyo, Japan

[73] Assignee: NEC Corporation, Tokyo, Japan

[21] Appl. No.: 827,193

[22] Filed: Mar. 27, 1997

[51] Int. Cl.$^6$ .................................................... G06F 11/00
[52] U.S. Cl. .............................................. 371/5.1; 371/36
[58] Field of Search .............................. 371/5.1, 5.5, 3.6, 371/5.4, 48

[56] References Cited

U.S. PATENT DOCUMENTS

| | | | |
|---|---|---|---|
| 4,891,812 | 1/1990 | Bocci et al. | 371/5.5 |
| 5,619,509 | 4/1997 | Maruyama et al. | 371/5.4 |

FOREIGN PATENT DOCUMENTS 4-198782   7/1992   Japan .

OTHER PUBLICATIONS

Ravi k. Gulati et al., "Detection of undetectable faults using IDDQ testing", International Test Conference 1992, pp. 770–777.

Primary Examiner—Phung M. Chung
Attorney, Agent, or Firm—Scully, Scott, Murphy & Presser

[57] ABSTRACT

The invention provides a test pattern selection method for testing of an integrated circuit which can achieve a high fault coverage using a small number of patterns and minimizes the total testing time. From within a test pattern file which includes L test patterns, N test patterns are read out as a set of temporarily selected patterns, and a fault coverage according to the combination of the N temporarily selected patterns is calculated. Then, one of the other test patterns is successively substituted into one of the N temporarily selected patterns and a fault coverage is calculated for each combination of test patterns. Then, N test patterns of a combination which exhibits the highest one of the fault coverages calculated in this manner are determined as finally selected patterns.

4 Claims, 12 Drawing Sheets

| TEST PATTERN \ NODE NUMBER | 0 | 1 | 2 | 3 | 4 |
|---|---|---|---|---|---|
| 1ST PATTERN | × | × | × | × | × |
| 2ND PATTERN | × | 1 | 0 | 1 | Z |
| 3RD PATTERN | 0 | 1 | 0 | 1 | × |
| 4TH PATTERN | 1 | 0 | 0 | 1 | 1 |
| 5TH PATTERN | 0 | × | × | 0 | 0 |

FIG. 5(b)

| TEST PATTERN \ NODE NUMBER | 0 | 1 | 2 | 3 | 4 |
|---|---|---|---|---|---|
| 1ST PATTERN | × | × | × | × | × |
| 2ND PATTERN | × | 1 | 0 | 1 | Z |
| 3RD PATTERN | 0 | 1 | 0 | 1 | × |

FIG. 6(a)

| TEST PATTERN \ NODE NUMBER | 0 | 1 | 2 | 3 | 4 |
|---|---|---|---|---|---|
| 4TH PATTERN | 1 | 0 | 0 | 1 | 1 |
| 2ND PATTERN | × | 1 | 0 | 1 | Z |
| 3RD PATTERN | 0 | 1 | 0 | 1 | × |

$$\text{FAULT COVERAGE} = \frac{3+4}{5*2} = 0.7$$

FIG. 6(b)

| TEST PATTERN \ NODE NUMBER | 0 | 1 | 2 | 3 | 4 |
|---|---|---|---|---|---|
| 1ST PATTERN | × | × | × | × | × |
| 4TH PATTERN | 1 | 0 | 0 | 1 | 1 |
| 3RD PATTERN | 0 | 1 | 0 | 1 | × |

$$\text{FAULT COVERAGE} = \frac{3+4}{5*2} = 0.7$$

FIG. 6(c)

| TEST PATTERN \ NODE NUMBER | 0 | 1 | 2 | 3 | 4 |
|---|---|---|---|---|---|
| 1ST PATTERN | × | × | × | × | × |
| 2ND PATTERN | × | 1 | 0 | 1 | Z |
| <u>4TH PATTERN</u> | 1 | 0 | 0 | 1 | 1 |

$$\text{FAULT COVERAGE} = \frac{2 + 4}{5 * 2} = 0.6$$

FIG. 6(d)

| TEST PATTERN \ NODE NUMBER | 0 | 1 | 2 | 3 | 4 |
|---|---|---|---|---|---|
| <u>5TH PATTERN</u> | 0 | × | × | 0 | 0 |
| 2ND PATTERN | × | 1 | 0 | 1 | Z |
| 3RD PATTERN | 0 | 1 | 0 | 1 | × |

$$\text{FAULT COVERAGE} = \frac{4 + 2}{5 * 2} = 0.6$$

FIG. 6(e)

| TEST PATTERN \ NODE NUMBER | 0 | 1 | 2 | 3 | 4 |
|---|---|---|---|---|---|
| 4TH PATTERN | 1 | 0 | 0 | 1 | × |
| 5TH PATTERN | 0 | × | × | 0 | 0 |
| 3RD PATTERN | 0 | 1 | 0 | 1 | × |

$$\text{FAULT COVERAGE} = \frac{5+4}{5*2} = 0.9$$

FIG. 6(f)

| TEST PATTERN \ NODE NUMBER | 0 | 1 | 2 | 3 | 4 |
|---|---|---|---|---|---|
| 4TH PATTERN | 1 | 0 | 0 | 1 | 1 |
| 2ND PATTERN | × | 1 | 0 | 1 | Z |
| 5TH PATTERN | 0 | × | × | 0 | 0 |

$$\text{FAULT COVERAGE} = \frac{5+4}{5*2} = 0.9$$

TEST PATTERN SELECTION METHOD FOR TESTING OF INTEGRATED CIRCUIT

BACKGROUND OF THE INVENTION

1. Field of the Invention

This invention relates to a test pattern selection method, and more particularly to a test pattern selection method for testing of IDDQ of a semiconductor integrated circuit (hereinafter referred to simply as IC).

2. Description of the Related Art

In recent years, as the scale and the complexity of circuits such as ICs increase, the difficulty in testing ICs increases. Meanwhile, the request of users for the quality is getting progressively severe, and it is difficult to improve the quality only by a conventional voltage test or function test. Thus, notice is taken of a technique called IDDQ testing (IDDQ inspection) as a new testing technique for improvement in quality. Generally, IDDQ testing is a testing technique which discriminates presence or absence of a fault by monitoring IDDQ because, if an IC suffers from a short-circuiting fault, a bridge fault or the like, then excessive IDDQ flows in a steady state, which proves presence of a fault.

In order to perform an IDDQ measurement, it must be waited that transient currents when the states of signals in an IC change from "1" to "0" or "0" to "1" are settled, and consequently, much time is required for a measurement. Therefore, if a large number of test patterns are involved, then very long time is required. Accordingly, in order to perform IDDQ testing, a smaller number of current measurement patterns for IDDQ testing must be selected from among available test patterns.

In particular, when a test is performed actually using a tester or a like instrument, test patterns are applied one after another to an IC to be tested. Then, when a measurement point at which IDDQ testing should be performed is reached, changing of the test pattern to be applied to the IC is stopped and the test pattern being applied at present is continuously applied fixedly to measure electric current. Thus, the number of test patterns which should be selected so that they may be continuously applied fixedly should be minimized to determine measurement points.

One of conventionally known pattern selection methods for IDDQ testing is disclosed, for example, in Ravi k. Gulati et al., "Detection of "undetectable" faults using IDDQ testing", INTERNATIONAL TEST CONFERENCE 1992, pp.770–777. This method will be described with reference to a flow chart of FIG. 8.

Figure 8:
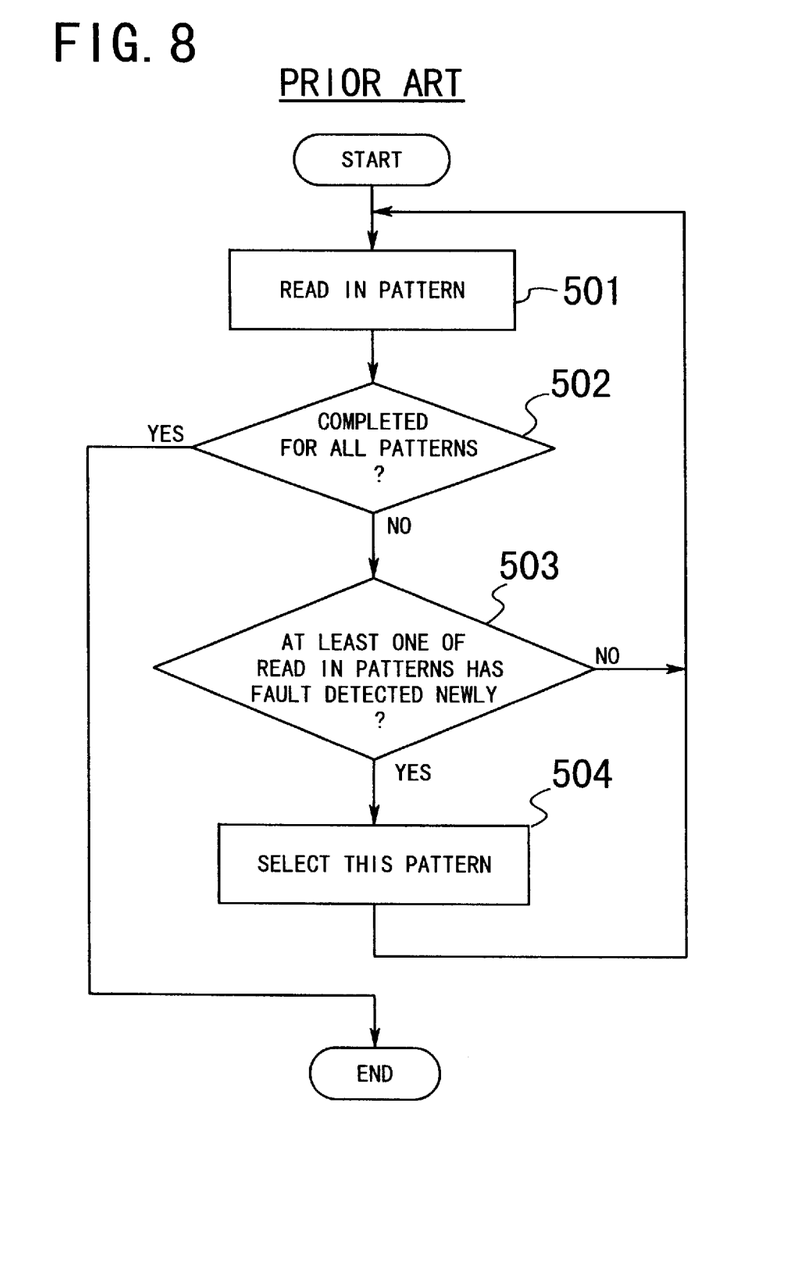
FIG. 8 is a flow chart illustrating a procedure of a conventional test pattern selection method.

First, one of test patterns is read in (step 501). Then, it is confirmed whether or not processing for all of the test patterns has been completed (step 502). If the processing has been completed, then a result of the processing is outputted. However, if the processing has not been completed, then it is discriminated whether or not at least one fault which makes a new target for IDDQ testing is detected (step 503).

If some fault is detected, then the pattern is selected (step 504). Then, a next one of the patterns is read in (step 503 to step 501). The sequence of operations described above is repeated until the processing for all of the patterns is completed (steps 501→502→503→ . . . ).

Another pattern selection method is disclosed, for example, in Japanese Patent Laid-Open Application No. Heisei 4-198782. This method will be described with reference to a flow art of FIG. 9.

Figure 9:
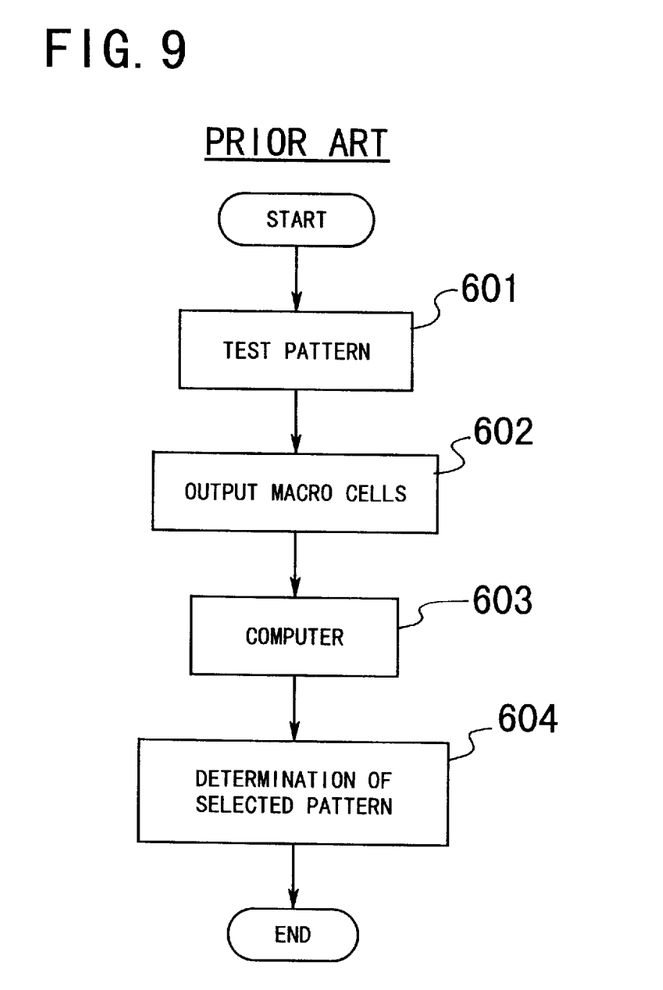
FIG. 9 is a flow chart illustrating a procedure of another conventional test pattern selection method.

First, based on output data (step 602) of internal macro cells in an IC corresponding to individual nodes of test patterns (step 601), patterns are selected by a computer (step 603), and the patterns are determined and outputted as selected patterns (step 604).

In order to maximize the IDDQ leak fault coverage of an IC to be tested, the logical output values of macro cells in the IC are fixed to "1" and then to "0", and IDDQ must be measured in the two cases. Therefore, in the computer for determining selected patterns (step 603), patterns are selected so that the two values of "1" and "0" of the logical output values of the macro cells may be involved and the number of test patterns to be selected may be minimized.

The methods described above are disadvantageous in the following points.

In the pattern selection method described hereinabove with reference to FIG. 8, if faults which make a target for IDDQ testing are detected using test patterns, then all such patterns are selected. Therefore, the number of patterns selected finally from all test patterns is indefinite and large. Further, when electric current is measured actually using a tester, fine electric current measurement is required. Therefore, the pattern selection method is disadvantageous in that, where a large number of patterns for measurement of electric current are involved, very long time is required for testing.

Further, since all test patterns make an object of processing for selection of patterns for IDDQ testing, the pattern selection method is disadvantageous also in that much processing time is required for pattern selection.

Meanwhile, in the pattern selection method described hereinabove with reference to FIG. 9, since all patterns wherein output values of macro cells in an IC to be tested include the two values of "1" and "0", even if a minimum number of patterns are selected, the number of patterns selected is indefinite and large similarly to the preceding pattern selection method. Consequently, the pattern selection method is disadvantageous in that impractical testing time is required.

SUMMARY OF THE INVENTION

It is an object of the present invention to provide a test pattern selection method which can perform an intended test in a comparatively short time.

In order to attain the object described above, according to the present invention, there is provided a test pattern selection method for testing of an integrated circuit wherein, from within a test pattern file which includes L test patterns for testing of an integrated circuit, N test patterns designated as selection patterns are selected, L being an integer equal to or larger than 2, N being a positive integer smaller than L, comprising the pattern reading step of reading out N test patterns as a set of temporarily selected patterns from the L test patterns in the test pattern file, the first fault rate calculation step of calculating a fault coverage of the combination of the N temporarily selected patterns, the second fault rate calculation step of successively substituting one of the other test patterns into one of the N temporarily selected patterns and calculating a fault coverage for each combination of test patterns, and a test pattern determination step for determining N test patterns of a combination which exhibits the highest one of the fault coverages calculated in the first fault rate calculation step and the second fault rate calculation step as finally selected patterns.

In the test pattern selection method for testing of an integrated circuit, from within a test pattern file which includes L test patterns, N test patterns are read out as a set of temporarily selected patterns, and a fault coverage of the N temporarily selected patterns is calculated. Then, one of the other test patterns is successively substituted into one of the N temporarily selected patterns and a fault coverage is calculated for each combination of test patterns. Then, N test patterns of a combination which exhibits the highest one of the fault coverages calculated in this manner are determined as finally selected patterns. Consequently, by designating a small number of patterns from within the test pattern file, a high fault coverage can be obtained with the small number of patterns. Consequently, the test pattern selection method is advantageous in that the total testing time can be minimized.

Preferably, the test pattern selection method for testing of an integrated circuit further comprises the testing suitableness discrimination step of discriminating whether or not the pattern to be used for substitution is suitable for the testing, the fault coverage according to the second fault rate calculation step being not calculated when the pattern to be used for substitution is not suitable for the testing. This can prevent such wrong detection that the integrated circuit has some fault arising from a bus fight.

For the pattern to be used for substitution in the second fault rate calculation step, the test patterns may be read out at intervals of M patterns from the test pattern file, M being a positive integer. In this instance, the processing speed of the selection processing can be varied arbitrarily in response to the reading jumping number M.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 5(a) and 5(b) are diagrammatic views showing an example of test patterns and wherein FIG. 5(a) shows all test patterns and FIG. 5(b) shows temporarily selected test patterns;

FIGS. 6(a) to 6(f) are tables showing test patterns changed in step 106 of FIG. 1 and wherein FIGS. 6(a) to 6(c) illustrate test patterns into which the fourth pattern shown in FIG. 5(a) is successively substituted and FIGS. 6(d) to 6(f) illustrate test patterns into which the fifth pattern shown in FIG. 5(b) is substituted;

DESCRIPTION OF THE PREFERRED EMBODIMENTS

Figure 1:
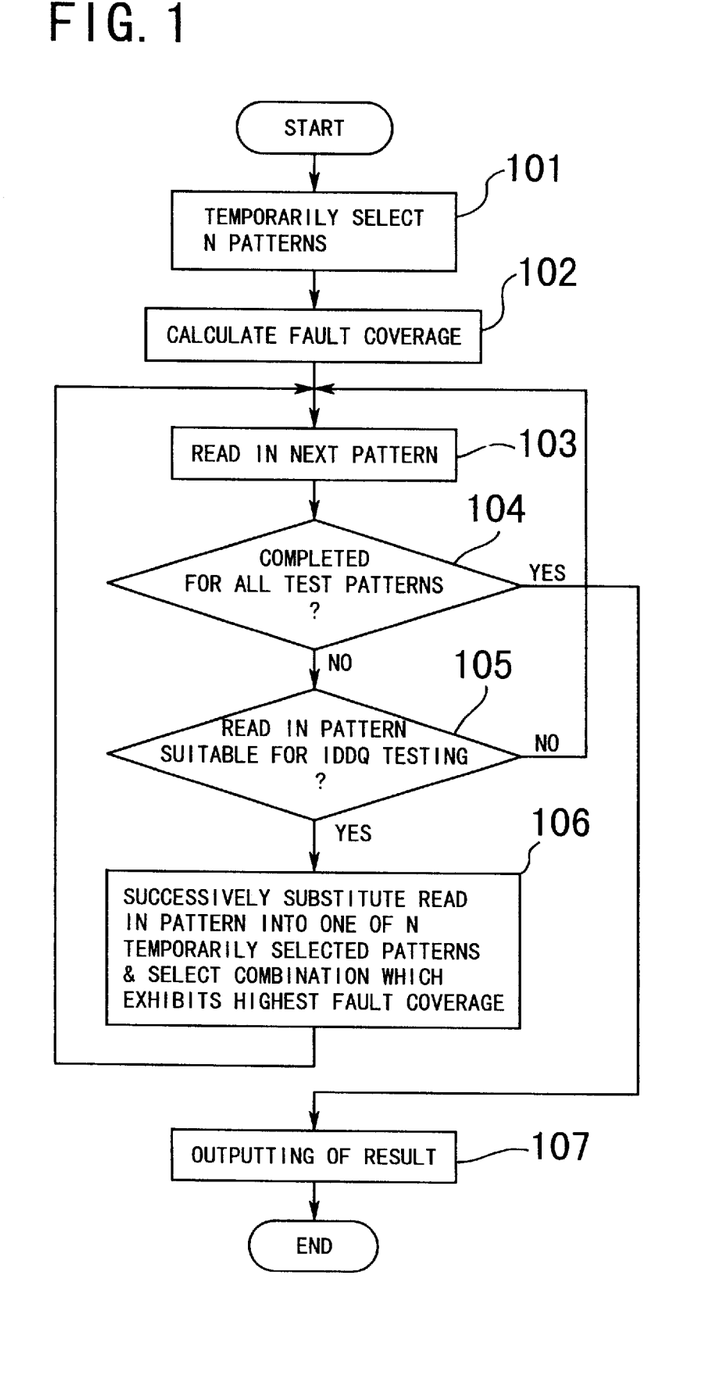
FIG. 1 is a flow chart illustrating a procedure of a test pattern selection method to which the present invention is applied.

FIG. 1 illustrates a procedure of a test pattern selection method to which the present invention is applied. Referring to FIG. 1, first N (N is a positive integer) patterns are temporarily selected from among totaling L (L is a positive integer larger than N) test patterns of a test pattern file (step 101). It is assumed that the test patterns used here have been produced, for example, using a simulation tool.

Then, a fault coverage according to the combination of the N temporarily selected patterns is calculated. The fault coverage (hereinafter referred to simply as "fault coverage") is calculated, for example, using the following expression (1):

$$\text{fault coverage} = (S0+S1)/(S*2) \qquad (1)$$

where S0 is the number of nodes which exhibit "0" at least once with the temporarily selected test patterns, S1 is the number of nodes which exhibit "1" at least once with the temporarily selected test patterns, and S is the total number of nodes. It is to be noted that the "nodes" here signifies signal lines in an IC.

Since, for expression (1) above, a stuck at fault model is used as a fault model, those patterns in which a comparatively large number of nodes are set to "0" or "1" should be retrieved from among the test patterns. Since this expression represents what number of nodes from within the total number of nodes are set to "0" or "1", if the value is high, then the fault coverage is high. It is to be noted that, since a stuck at fault model is a mere example of fault model, if it is desired to detect some other fault, then an expression suitable for a model of the fault should be used.

Referring back to FIG. 1, a next pattern is read in from within the file of the test patterns (step 103). Then, it is confirmed whether or not the processing for all test pattern has been completed (step 104).

Then, it is discriminated whether or not the pattern read in in step 103 is a pattern which has a state which is not suitable for IDDQ testing (step 105).

Figure 2:
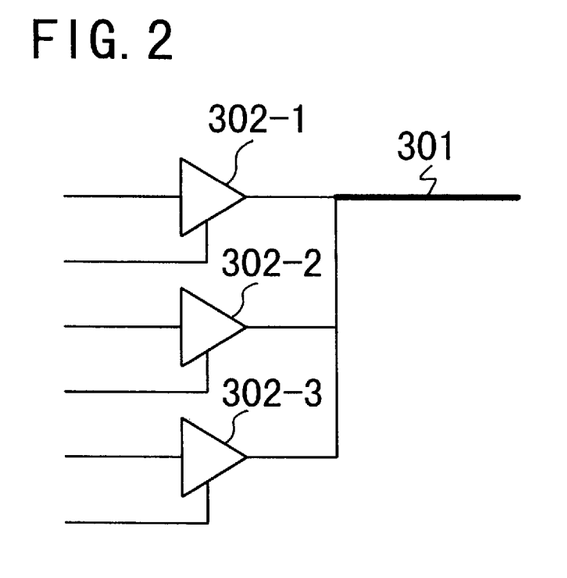
FIG. 2 is a circuit diagram illustrating a pattern which has a state which is not suitable for IDDQ testing.

Here, a criterion for whether or not a pattern is suitable will be described with reference to FIG. 2. FIG. 2 shows a circuit wherein outputs of three tri-state buffers 302-1, 302-2 and 302-3 are wired connected. In FIG. 2, a portion indicated by a thick line corresponds to one node mentioned above.

If a bus fight occurs in the output line 301 of the circuit shown in FIG. 2, then excessive IDDQ flows in a steady state, and although the circuit does not have a fault, it is recognized in error that the circuit has some fault. Consequently, where a pattern which causes such bus fight is included in test patterns, the pattern is unsuitable as an IDDQ test pattern, and accordingly, the pattern must be removed from an object of selection.

Here, detailed processing in step 105 will be described with reference to a flow chart of FIG. 3.

In order to discriminate whether or not a pattern is suitable for IDDQ testing, a portion in the inside of an IC of an object of testing in which electric current may possibly flow in a steady state is searched out to determine whether or not the pattern is suitable. Therefore, net list description information from which an internal construction of an IC of an object of testing can be known is required. If the net list is read in every time in step 105, then it is read in every time before processing for the test patterns is completed. This requires much processing time. Therefore, the net list is read in prior.

Figure 3:
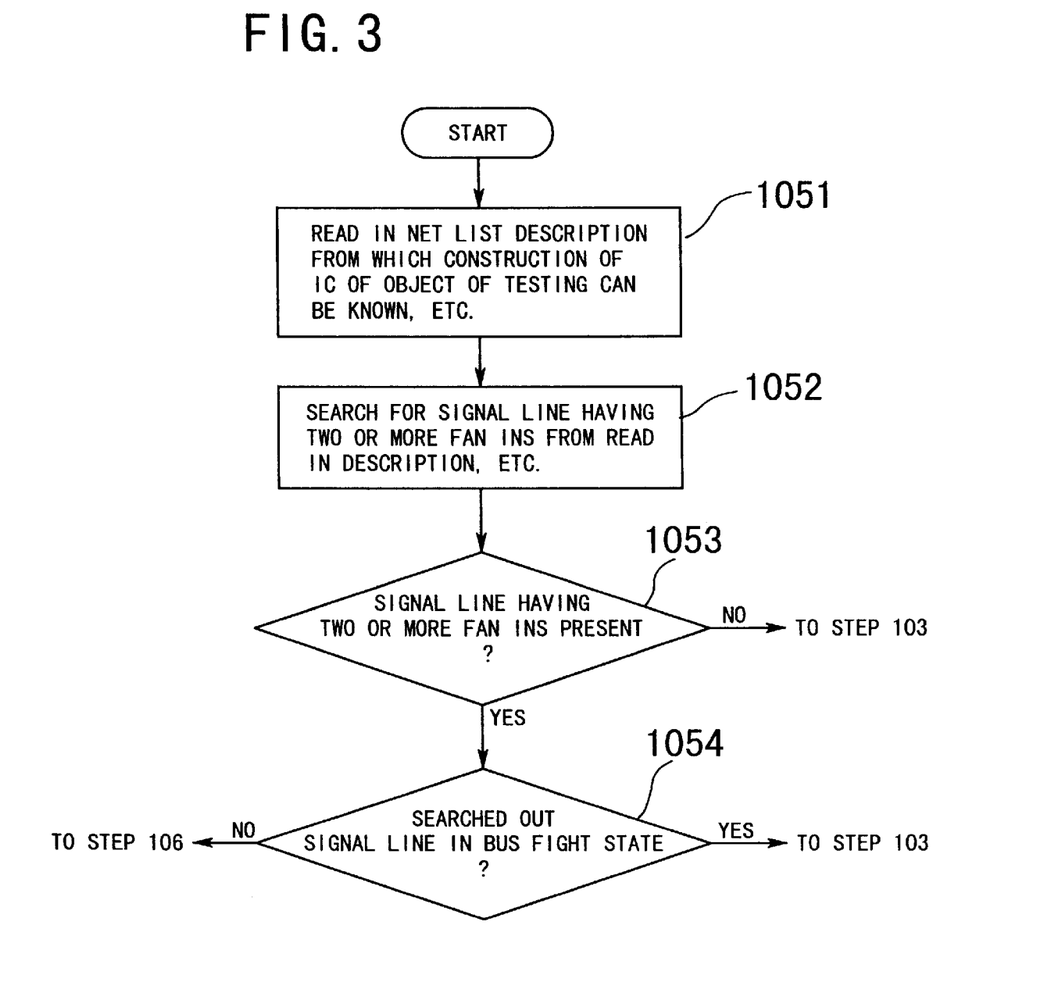
FIG. 3 is a flow chart illustrating detailed operation in step 105 of FIG. 1.

Referring to FIG. 3, net list description information from which the construction of the IC of the object of testing and so forth are read in (step 1051). Then, signal lines which have two or more fan ins (that is, wired connected signal lines) are all searched out from the description information and so forth thus read in (step 1052). If a signal line which has two or more fan ins is not present, then the control sequence returns to step 103 in FIG. 1 (step 1053).

If a signal line or lines which have two or more fan ins are present, then it is checked whether or not a bus fight condition is entered if a test is performed using the pattern read in in step 103 of FIG. 1 (step 1054). If a bus fight condition is entered, then the control sequence returns to step 103 of FIG. 1. But if a bus fight condition is not entered, then the control sequence advances to step 106 (step 1054).

It is to be noted that the bus fight signifies a condition wherein signal lines are wired connected to each other and the values of the signal lines are unknown.

Any pattern which is determined to be unsuitable in step 105 is removed from an object of selection, and the control sequence returns to step 103, in which a next pattern is read in from the file of the test patterns. The operations in steps 103 to 105 are repeated until a suitable pattern is reached. For any other unsuitable state than the bus fight, the pattern may be determined to be removed from an object of selection in step 105. In this instance, a pattern which is determined to be unsuitable by simulation should be determined to be removed from an object of selection.

Then, a pattern which has been determined to be suitable is successively substituted in order into one of the N patterns temporarily selected already, and fault coverages for individual combinations are calculated. In this instance, the suitable pattern is successively substituted in order beginning with the first pattern of the N patterns and ending with the Nth pattern, and consequently, N fault coverages are calculated. Then, if one of the fault coverages calculated after the individual substitutions which exhibits the highest value is higher than the fault coverage of the pattern of the combination temporarily selected already, then the pattern of the combination which exhibits the highest fault coverage is determined as a new temporarily selected pattern (step 106). It is assumed that, in the present example, if the values of the two fault coverages here are equal to each other, then the pattern for which substitution has been performed formerly is preferentially determined as a temporarily selected pattern.

Figure 4:
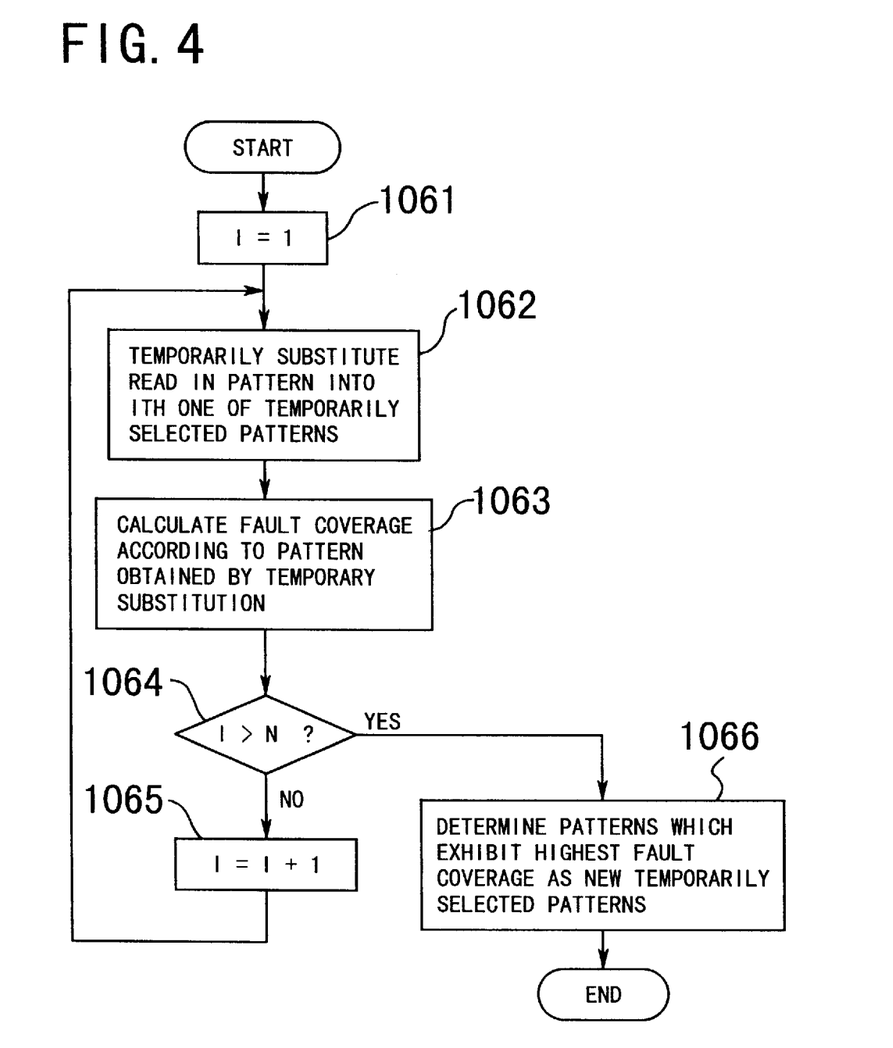
FIG. 4 is a flow chart illustrating detailed operation in step 106 of FIG. 1.

Here, detailed processing in step 106 will be described with reference to the flow chart of FIG. 4.

First, "1" is substituted as an initial value into a variable I (step 1061). Then, the pattern read in in step 103 of FIG. 1 is temporarily substituted into the first pattern from among the temporarily selected patterns (step 1062). A fault coverage is calculated for the pattern obtained by the temporary substitution (step 1063).

Here, if the value of the variable I is equal to or lower than the value of N, then "I+1" is substituted into the variable I (step 1064 to step 1065). Then, the processing in steps 1062 and 1063 is performed similarly.

If the value of the variable I is higher than the value of N in step 1064, then if the fault coverages according to the patterns of the combinations obtained by such substitutions are higher than the fault coverage of the temporarily selected pattern, then one of the fault coverages which is highest among them is determined as a new temporarily selected pattern (step 1064 to step 1066).

Referring back to FIG. 1, in step 103, a next pattern is read in from the file of the test patterns. Thus, the operations in steps 103 to 106 are repeated until the processing for all of the test patterns is completed. If completion of the processing for all test patterns is confirmed, then the selection of patterns is completed, and N test patterns of the combination which exhibits the highest fault coverage are determined as finally selected patterns and this result is outputted (step 107).

An example of more detailed pattern selection processing will be described with reference to FIGS. 5(a) and 5(b). It is assumed that, in the example, the number of test patterns is "5", the number of nodes in each of the test patterns is "5", and the number of patterns to be selected is "3".

Figure 5A:
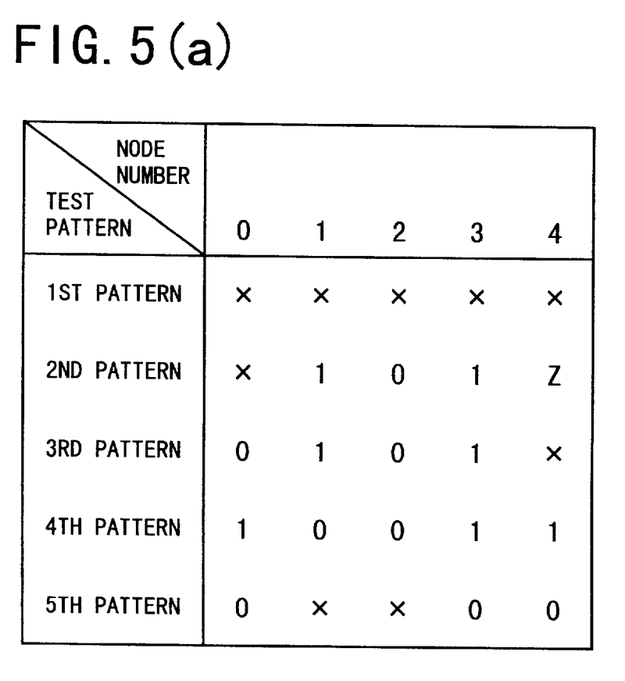

FIG. 5(a) illustrates contents of the test pattern file, which includes, in the example shown, five patterns of the first to fifth patterns (that is, S=5). It is to be noted that the mark "x" in FIGS. 5(a) and 5(b) indicates "unknown", and "z" indicates "high impedance".

Since the selected pattern number is "3", the first to third patterns are read in and temporarily selected in step 101 in accordance with the flow chart of FIG. 1. The temporarily selected patterns are shown in FIG. 5(b). Then, the fault coverage according to the combination of the three patterns of the first to third patterns is calculated using expression (1) given hereinabove.

Figure 5B:
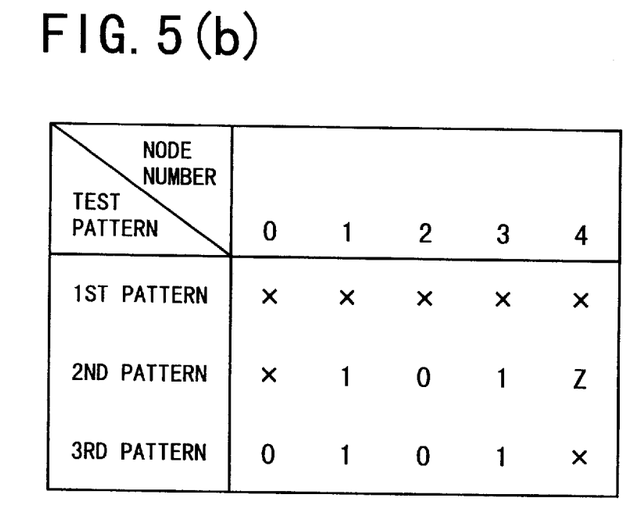

As seen from FIG. 5(b), from within the temporarily selected patterns, those nodes which exhibit "0" at least once are two nodes of the node number 0 and the node number 2 (S0=2), and those nodes which exhibit "1" at least once are two nodes of the node number 1 and the node number 3 (S1=2). Consequently, the fault coverage according to the combination of the temporarily selected patterns is fault coverage=(2+2)/(5*2)=0.4

Thereafter, the fourth pattern as a next pattern is read in from within the test pattern file (step 103). Then, it is discriminated whether or not the processing for the entire test pattern file has been completed (step 104). In the present example, since the test pattern number is "5", the processing is not completed, and it is discriminated whether or not the fourth pattern is suitable for IDDQ testing (step 105). In this instance, it is assumed that all patterns are suitable. Thus, the control sequence advances to a next step.

Then, the fourth pattern is successively substituted into one of the three patterns temporarily selected already, and the fault coverage is calculated for each combination (step 106). The conditions wherein the fourth pattern is substituted into the three patterns shown in FIG. 5(b) are shown in FIGS. 6(a) to 6(c).

Figure 6A:
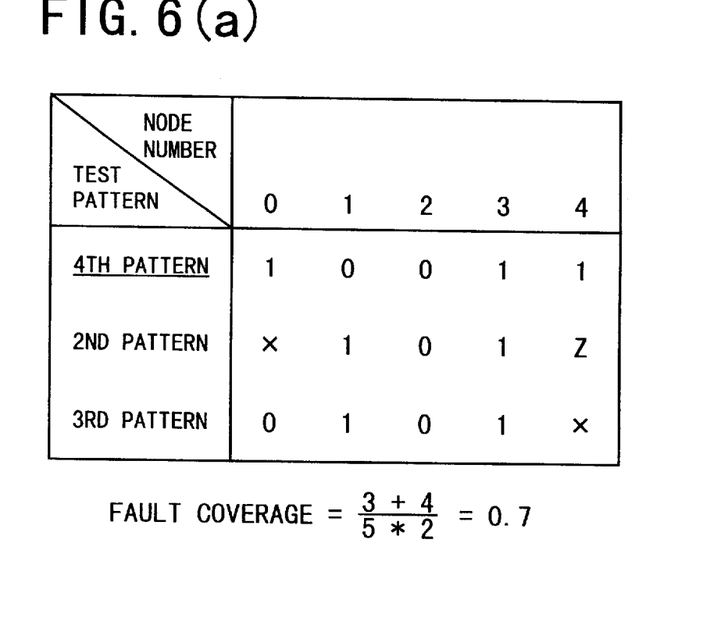

As seen from FIG. 6(a), when the fourth pattern is substituted into the first pattern in FIG. 5(b) (indicated by an underline in FIG. 6(a)), those nodes which exhibit "0" at least once are three nodes of the node number 0, the node number 1 and the node number 2 (S0=3), and those nodes which exhibit "1" at least once are four nodes of the node number 0, the node number 1, the node number 3 and the node number 4 (S1=4). Consequently, the fault coverage according to this combination is fault coverage=(3+4)/(5*2)=0.7

Figure 6B:
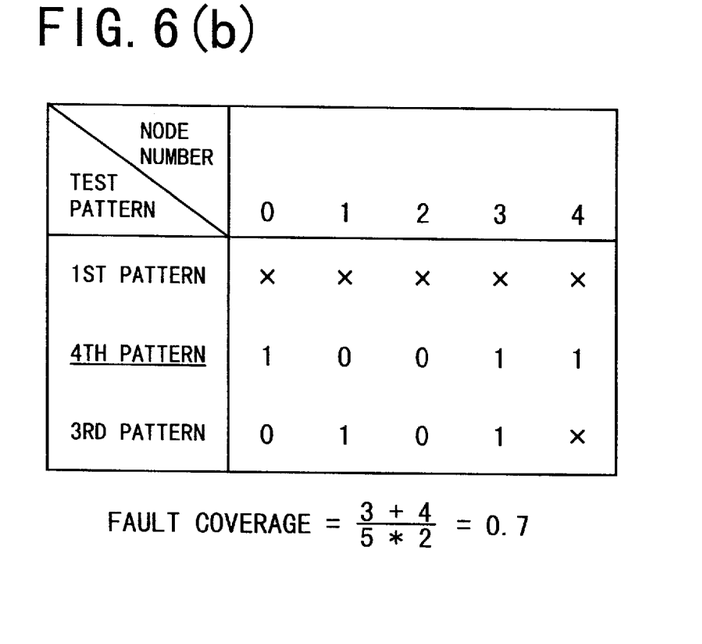

Then, as seen from FIG. 6(b), when the fourth pattern is substituted into the second pattern in FIG. 5(b) (indicated by an underline in FIG. 6(b)), those nodes which exhibit "0" at least once are three nodes of the node number 0, the node number 1 and the node number 2 (S0=3), and those nodes which exhibit "1" at least once are four nodes of the node number 0, the node number 1, the node number 3 and the node number 4 (S1=4). Consequently, the fault coverage according to this combination is fault coverage=(3+4)/(5*2)=0.7

Figure 6C:
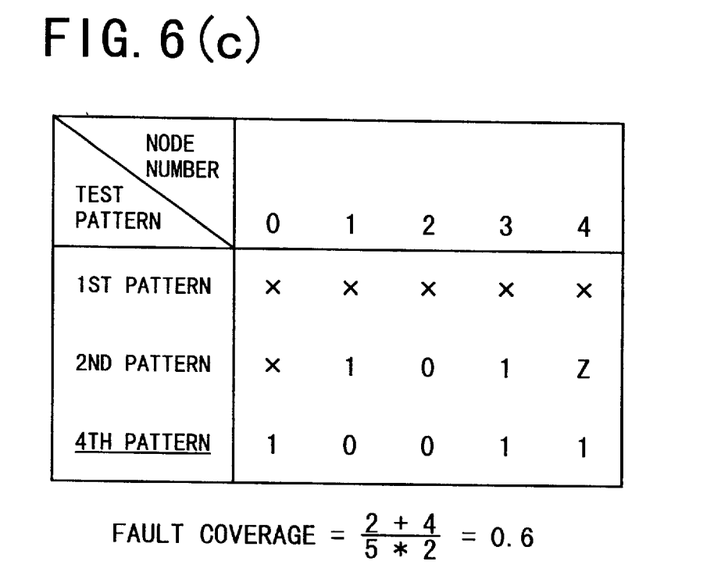

Further, as seen from FIG. 6(c), when the fourth pattern is substituted into the third pattern in FIG. 5(b) (indicated by an underline in FIG. 6(c)), those nodes which exhibit "0" at least once are two nodes of the node number 1 and the node number 2 (S0=2), and those nodes which exhibit "1" at least once are four nodes of the node number 0, the node number 1, the node number 3 and the node number 4 (S1=4). Consequently, the fault coverage according to this combination is fault coverage=(2+4)/(5*2)=0.6

From the foregoing, from among the combinations of FIGS. 6(a), 6(b) and 6(c), those combinations of FIGS. 6(a) and 6(b) exhibit the highest fault coverage. As described hereinabove, when an equal fault coverage is exhibited, that one of combinations for which substitution has been performed formerly is preferentially adopted, and therefore, the fourth pattern is substituted into the first pattern shown in FIG. 5(b). By this substitution, the combination of FIG. 6(b), that is, the combination of the fourth pattern, the second pattern and the third pattern is temporarily selected.

Then, referring back to FIG. 1, a next pattern, that is, the fifth pattern, is read in from the test pattern file (step 103). Then, it is discriminated whether or not the processing for all of the test pattern files has been completed (step 104). In this instance, however, since the test pattern number is "5", the processing has not been completed, and it is discriminated whether or not the fifth pattern is suitable for IDDQ testing (step 105). In this instance, it is assumed that all of the patterns are suitable. Thus, the control sequence advances directly to a next step.

Then, the fifth pattern is successively substituted into one of the three patterns of the fourth pattern, the second pattern and the third pattern temporarily selected already, and the fault coverage is calculated for each combination (step 106). The thus substituted conditions are illustrated in FIGS. 6(d) to 6(f).

Figure 6D:
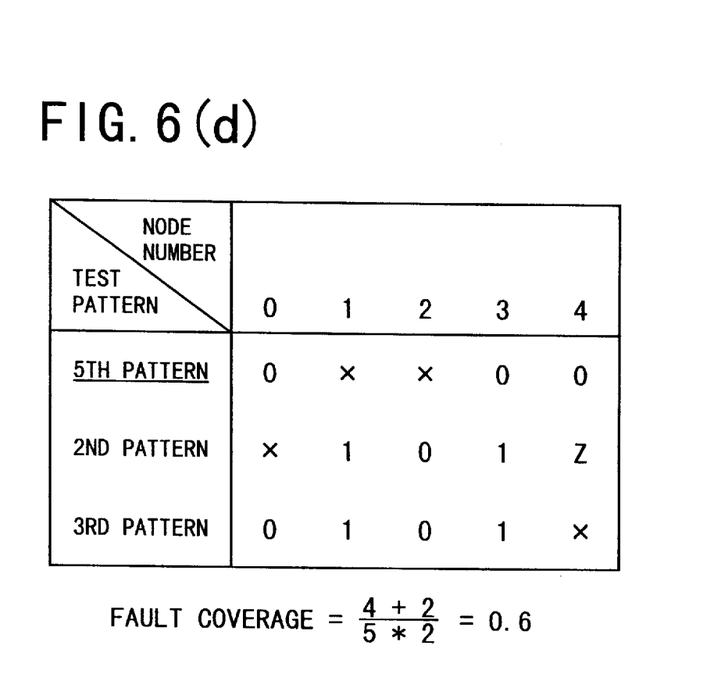

As seen from FIG. 6(d), when the fifth pattern is substituted into the fourth pattern in FIG. 5(a) (indicated by an underline in FIG. 6(a)), those nodes which exhibit "0" at least once are four nodes of the node number 0, the node number 2, the node number 3 and the node number 4 (S0=4), and those nodes which exhibit "1" at least once are two nodes of the node number 1 and the node number 3 (S1=2). Consequently, the fault coverage according to this combination is fault coverage=(4+2)/(5*2)=0.6

Figure 6E:
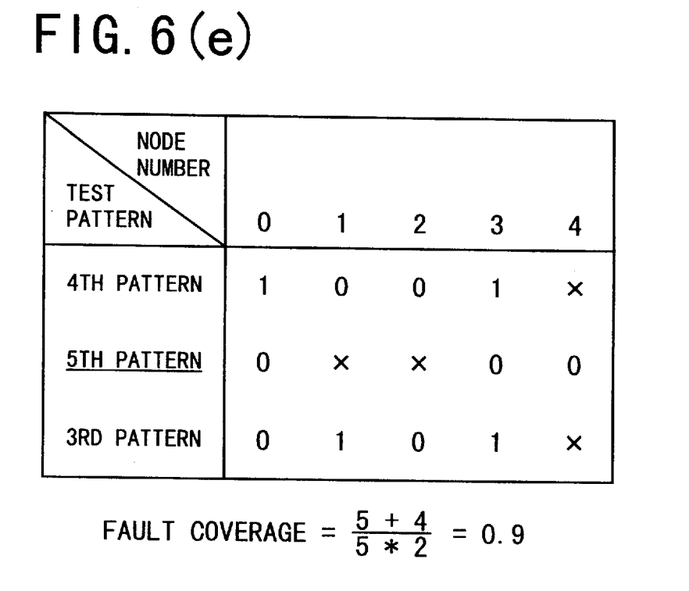

Then, as seen from FIG. 6(e), when the fifth pattern is substituted into the second pattern in FIG. 5(a) (indicated by an underline in FIG. 6(e)), those nodes which exhibit "0" at least once are five nodes of the node number 0, the node number 1, the node number 2, the node number 3 and the node number 4 (S0=5), and those nodes which exhibit "1" at least once are four nodes of the node number 0, the node number 1, the node number 3 and the node number 4 (S1=4). Consequently, the fault coverage according to this combination is fault coverage=(5+4)/(5*2)=0.9

Figure 6F:
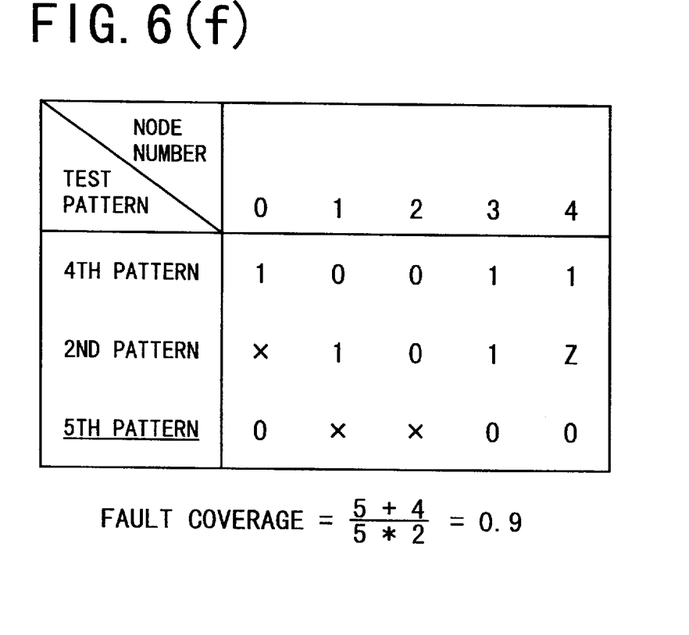

Further, as seen from FIG. 6(f), when the fifth pattern is substituted into the third pattern in FIG. 5(a) (indicated by an underline in FIG. 6(f)), those nodes which exhibit "0" at least once are five nodes of the node number 0, the node number 1, the node number 2, the node number 3 and the node number 4 (S0=5), and those nodes which exhibit "1" at least once are four nodes of the node number 0, the node number 1, the node number 3 and the node number 4 (S1=4). Consequently, the fault coverage according to this combination is fault coverage=(5+4)/(5*2)=0.9

From the foregoing, from among the combinations of FIGS. 6(d), 6(e) and 6(f), those combinations of FIGS. 6(e) and 6(f) exhibit the highest fault coverage. As described hereinabove, when an equal fault coverage is exhibited, that one of combinations for which substitution has been performed formerly is preferentially adopted, and therefore, the fifth pattern is substituted into the second pattern shown in FIG. 6(a). By this substitution, the fourth pattern, the fifth pattern and the third pattern are temporarily selected.

Referring back to FIG. 1, it is tried to read a next pattern from within the test pattern file (step 103). However, since no sixth pattern is present, it is discriminated that the processing for the entire test pattern file has been completed, and the pattern selection processing is completed and this result is outputted (step 104 to step 107). After all, in the present example, the fourth pattern, the fifth pattern and the third pattern in combination shown in FIG. 6(e) are selected as test patterns. It is to be noted that, even if substitution of patterns is performed, the order in which the patterns are applied is an ascending order, and in an actual test, the selected patterns are applied in order of the third pattern, the fourth pattern and the fifth pattern.

Since a next pattern read in every time is successively substituted into temporarily selected patterns as described above, when the processing for all test patterns is completed finally, those patterns which exhibit the highest fault coverage from within a designated number of patterns are selected. Further, since not all patterns are read in at a time but patterns are read in one after another to perform processing, the amount of a memory to be used can be suppressed to the minimum.

Figure 7:
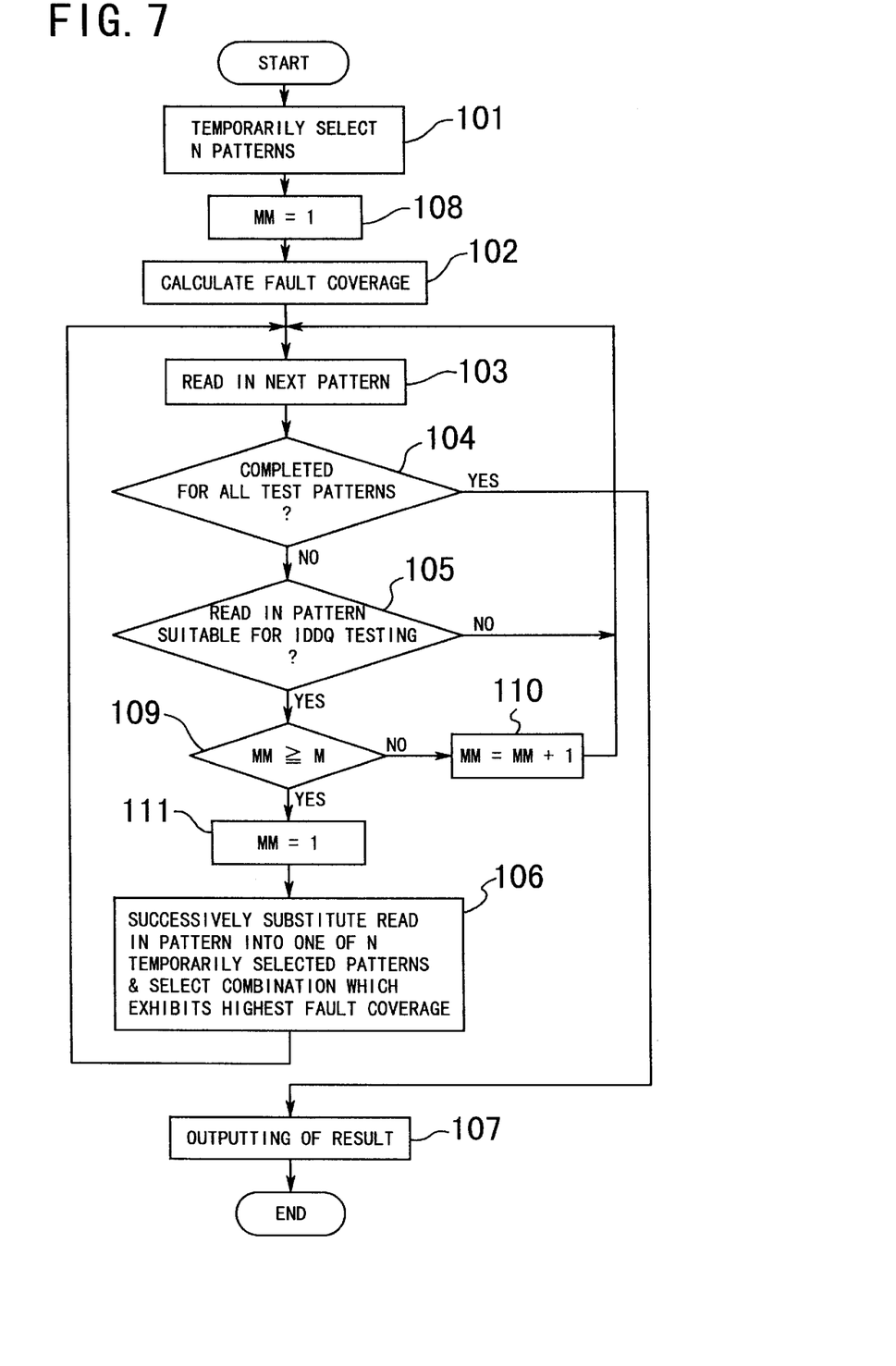
FIG. 7 is a flow chart illustrating a procedure of another test pattern selection method to which the present invention is applied.

FIG. 7 illustrates a procedure of another test pattern selection method to which the present invention is applied. In FIG. 7, like steps to those of FIG. 1 are denoted by like reference numerals. Different from the test pattern selection method illustrated in FIG. 1, in the present test pattern selection method, patterns of a test pattern file are read out at intervals of M patterns in steps 108 to 111 added newly. In particular, the patterns in the test pattern file are successively read out at intervals of a designated number M of patterns, and processing similar to that in the first test pattern selection method is performed. The number M here will be hereinafter referred to as jumping pattern number.

First, initialization for counting for test pattern jumping is performed (step 108).

The step 108, however, need not be provided between steps 101 and 102 if it is not included in the loop of steps 103 to 106. As an example, it is assumed that the count variable MM is a positive integer, and "1" is substituted into the count variable MM in step 108. The operations in steps 102 to 105 are similar to those described hereinabove in connection with the test pattern selection method with reference to FIG. 1.

Then, in step 109, the pattern jumping number M and the count variable MM are compared with each other. If the value of the count variable MM is equal to or higher than the value of the pattern jumping number M, then the control sequence advances to step 106.

Here, if the pattern jumping number M is "1", the requirement of the comparison expression (MM≦M) in step 109 is always satisfied. Therefore, in this instance, the processing in step 106 is performed for one after another of the test patterns similarly as in the test pattern selection method described hereinabove with reference to FIG. 1.

On the other hand, where the pattern jumping number M has a value equal to or higher than 2, the requirement of the comparison expression given above is not satisfied first. Therefore, the count variable MM is incremented by "1" in step 110, and then, a next pattern is read in. Then, if the requirement of the comparison expression is satisfied, then the count variable MM is reset to its initial value in step 111, and then the processing in step 106 is performed.

In short, in the present test pattern selection method, since the pattern jumping number can be designated as described above, the processing time in step 106 which has a significant influence on the processing time for pattern selection can be reduced, and the total processing time can be reduced comparing with that required in the test pattern selection method of FIG. 1.

While depending upon the type of test patterns, it is considered that the state in the inside of an IC does not normally exhibit a large variation between two adjacent test patterns. Therefore, even if not all patterns read in are determined as an object of selection but the patterns are read in at intervals of patterns and the thus read in patterns are determined as an object of selection, the improvement in fault coverage cannot be disturbed by a large amount. Accordingly, the time required for pattern selection processing itself can be reduced by reading patterns jumping them by a designated number in this manner.

If the value of the designated reading jumping number is large, then the fault coverage is degraded comparing with another case wherein pattern selection processing is performed reading in patterns one after another, but higher speed selection processing is performed. On the other hand, if the reading jumping number is set to a low value, then the degradation of the fault coverage is little, but the speed in selection processing drops. In this manner, the processing speed of the selection processing can be varied freely in response to the reading jumping number.

If it is assumed that, for example, 1,000 test patterns are involved, then according to the test pattern selection method of FIG. 1, the patterns are read in one after another pattern beginning with the first pattern and ending with the 1,000th pattern. Accordingly, the processing in step 106 is performed 1,000 times. On the other hand, with the test pattern selection method of FIG. 7, if the pattern reading jumping number is set to "2", then since the patterns are read in at intervals of 2 patterns, the processing in step 106 is performed 500 times. Consequently, the processing number of times of step 106 is reduced to ½ comparing with that of the test pattern selection method of FIG. 1.

It is to be noted that, while, in the test pattern selection methods of FIGS. 1 and 7, the present invention is applied to pattern selection for IDDQ testing, the application thereof is not limited to the pattern selection for IDDQ testing, and the present invention can apparently be applied also to pattern selection for various tests.

Having now fully described the invention, it will be apparent to one of ordinary skill in the art that many changes and modifications can be made thereto without departing from the spirit and scope of the invention as set forth herein.

What is claimed is:

1. A test pattern selection method for testing of an integrated circuit wherein, from within a test pattern file which includes L test patterns for testing of an integrated circuit, N test patterns designated as selection patterns are selected, L being an integer equal to or larger than 2, N being a positive integer smaller than L, comprising:

the pattern reading step of reading out N test patterns as a set of temporarily selected patterns from the L test patterns in the test pattern file;

the first fault rate calculation step of calculating a fault coverage of the combination of the N temporarily selected patterns;

the second fault rate calculation step of successively substituting one of the other test patterns into one of the N temporarily selected patterns and calculating a fault coverage for each combination of test patterns; and a test pattern determination step for determining N test patterns of a combination which exhibits the highest one of the fault coverages calculated in the first fault rate calculation step and the second fault rate calculation step as finally selected patterns.

2. A test pattern selection method for testing of an integrated circuit as claimed in claim 1, further comprising the testing suitableness discrimination step of discriminating whether or not the pattern to be used for substitution is suitable for the testing, the fault coverage according to the second fault rate calculation step being not calculated when the pattern to be used for substitution is not suitable for the testing.

3. A test pattern selection method for testing of an integrated circuit as claimed in claim 1 or 2, wherein, for the pattern to be used for substitution in the second fault rate calculation step, the test patterns are read out at intervals of M patterns from the test pattern file, M being a positive integer.

4. A test pattern selection method for testing of an integrated circuit as claimed in claim 1 or 2, wherein the test patterns are patterns for testing of IDDQ of a semiconductor integrated circuit.

* * * * *